US012633336B2

(12) United States Patent
Sharma et al.

(10) Patent No.: US 12,633,336 B2
(45) Date of Patent: May 19, 2026

(54) SRAM CELLS FOR LOW TEMPERATURE INTEGRATED CIRCUIT OPERATION

(71) Applicant: Intel Corporation, Santa Clara, CA (US)

(72) Inventors: Abhishek Anil Sharma, Portland, OR (US); Wilfred Gomes, Portland, OR (US); Rajabali Koduri, Saratoga, CA (US); Pushkar Ranade, San Jose, CA (US); Sagar Suthram, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 171 days.

(21) Appl. No.: 17/711,906

(22) Filed: Apr. 1, 2022

(65) Prior Publication Data

US 2023/0317146 A1      Oct. 5, 2023

(51) Int. Cl.
*G11C 11/412* (2006.01)
*H10B 10/00* (2023.01)

(52) U.S. Cl.
CPC .......... *G11C 11/412* (2013.01); *H10B 10/125* (2023.02); *H10B 10/18* (2023.02)

(58) Field of Classification Search
None
See application file for complete search history.

(56) References Cited

U.S. PATENT DOCUMENTS

| | | | |
|---|---|---|---|
| 6,920,061 B2 | 7/2005 | Bhavnagarwala et al. | |
| 2005/0047196 A1* | 3/2005 | Bhavnagarwala .... | G11C 11/412 |
| | | | 365/154 |
| 2017/0162252 A1* | 6/2017 | Ware ................... | G11C 11/4076 |
| 2019/0189195 A1* | 6/2019 | Na ........................ | H10D 84/834 |
| 2020/0176321 A1* | 6/2020 | Guler .................... | H10D 84/83 |
| 2021/0056028 A1* | 2/2021 | Ray ..................... | G06F 12/0811 |
| 2022/0085035 A1* | 3/2022 | Wang ................... | G11C 11/412 |
| 2022/0223496 A1* | 7/2022 | Chanemougame | .......................... |
| | | | H10D 30/6757 |

* cited by examiner

*Primary Examiner* — Khaja Ahmad
(74) *Attorney, Agent, or Firm* — Essential Patents Group, LLP

(57) ABSTRACT

Integrated circuits including static random-access memory (SRAM) bit-cells that are actively cooled to a low temperature (e.g., in the cryogenic range) where transistor drive currents become significantly increased and transistor leakage currents significantly reduced. With the drive current improvement, bit-cell capacitance may be reduced by defining narrower transistor fin structures and/or four transistor (4T) bit-cells may be implemented, for example with two parallel transistor fins and colinear gate electrodes.

4 Claims, 11 Drawing Sheets

100

101

110

102    103    104    102

105

111

106

BLB    WL    BL

Vcc

120

N2    N1

130

Vss

125

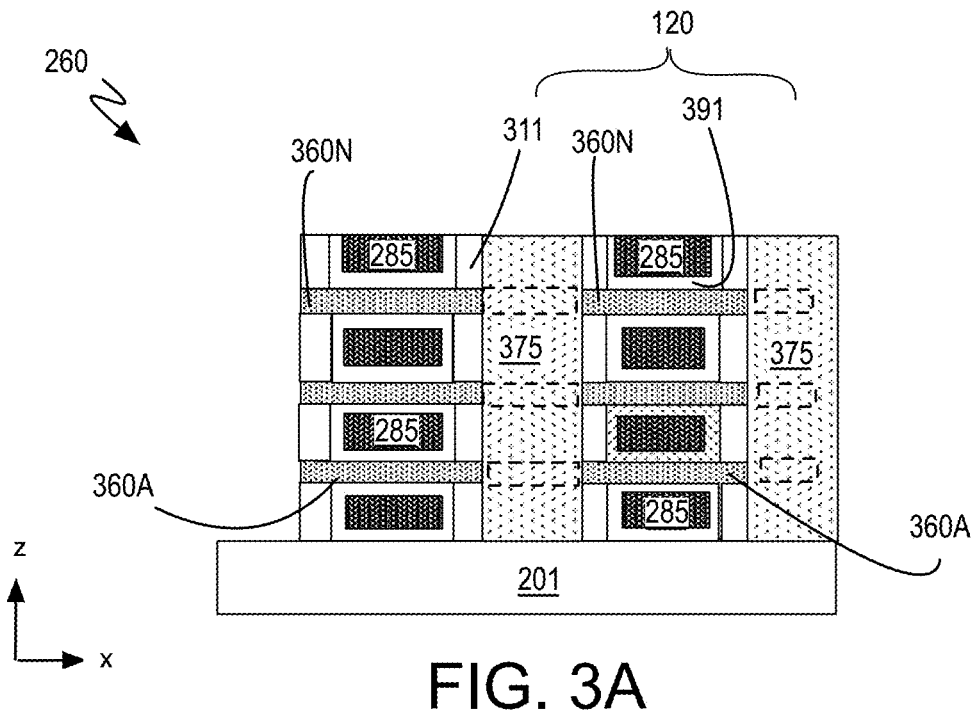
FIG. 3A
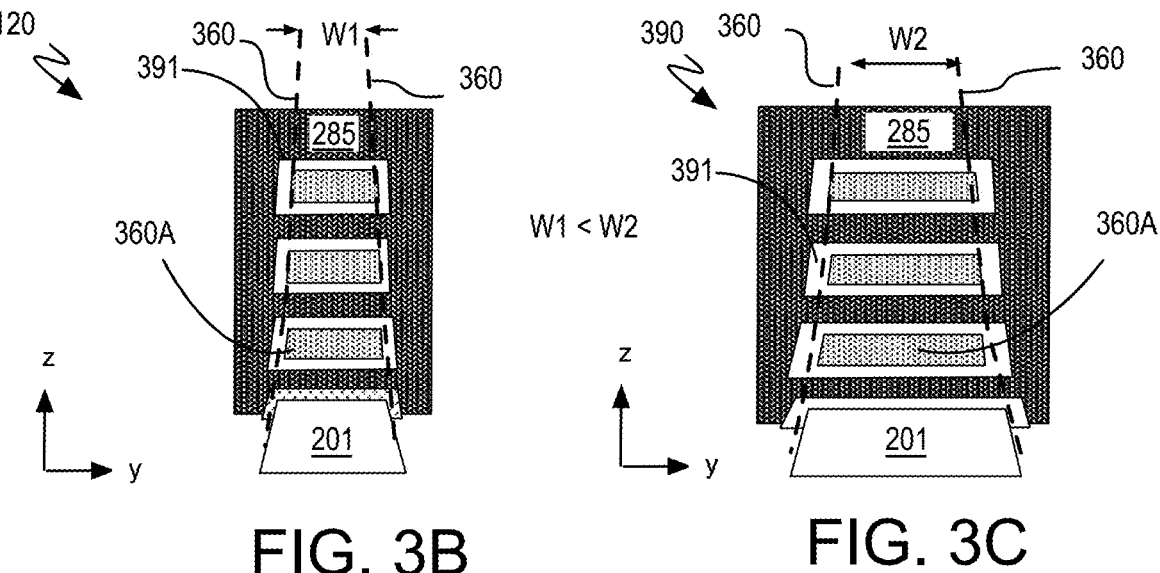
FIG. 3B     FIG. 3C

401

BL                          BLB
          WL
          130

N2          N1

125              Vss

402

BL                          BLB
          WL
          130

N2          N1

125              Vss

403

120     Vcc

N2          N1

130
          WL
BL              BLB

404

120     Vcc

N2          N1

130
          WL
BL              BLB

SRAM CELLS FOR LOW TEMPERATURE INTEGRATED CIRCUIT OPERATION

BACKGROUND

Integrated circuit (IC) devices often include static random-access memory (SRAM). Microprocessor chips, for example, dedicate a significant amount of chip area to SRAM arrays as a lowest level cache storing bits for processing by arithmetic logic units (ALUs). An SRAM array includes a plurality of SRAM bit cells. SRAM array density is dependent on bit-cell height, which further depends on the minimum dimensions of lines and spaces for a given patterned feature layer, as well as overlay tolerances between successive patterned layers. Attempts to employ fewer six transistors (6T) in a cell have not been widely implemented because of compromised SRAM performance, with such cells designs often suffering high leakage currents. Simply scaling the dimensions of lines and spaces of features in an SRAM cell can also compromise SRAM performance, for example with drive current decreasing and parasitic capacitance increasing causing resistance-capacitance (RC) delay products to get worse.

Accordingly, solutions to improve SRAM density while still maintaining cell performance are commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 3A and 3B illustrate orthogonal cross-sections through a stacked nanosheet transistor fin within the 6T SRAM cell illustrated in FIG. 2, in accordance with some embodiments;

FIG. 3C illustrates a cross-sectional view through a stacked nanosheet transistor fin in at least one logic circuitry block of the microprocessor illustrated in FIG. 1A, in accordance with some embodiments;

DETAILED DESCRIPTION OF EXEMPLARY EMBODIMENTS

Figure 1A:
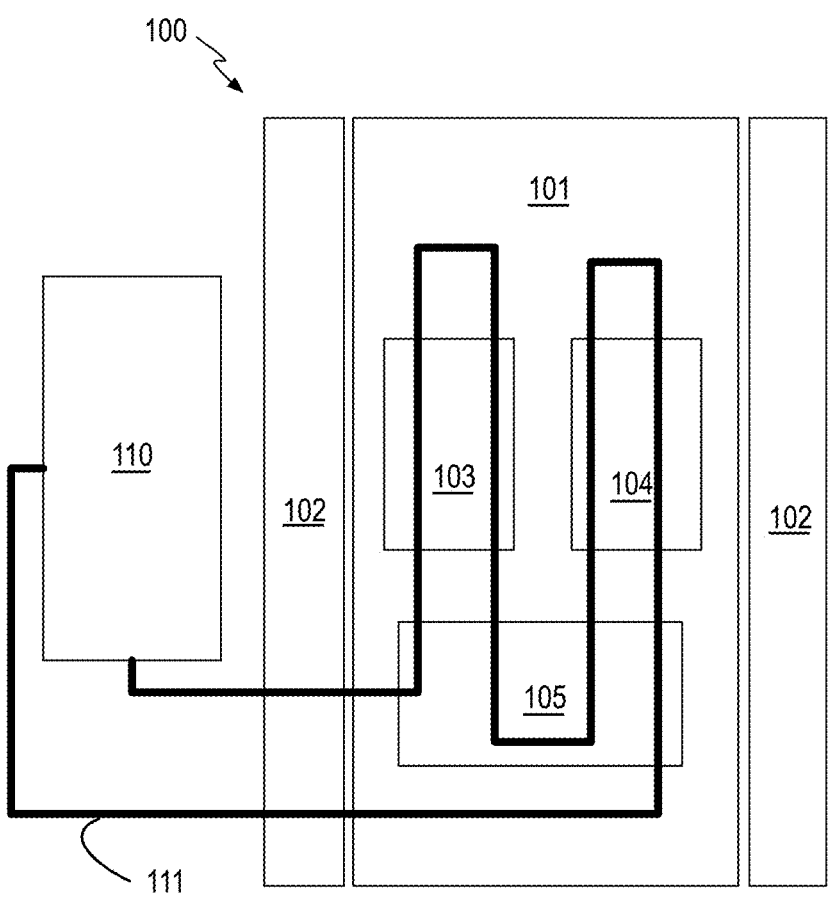
FIG. 1A illustrates a schematic of functional blocks in a microprocessor, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

FIG. 1A illustrates a schematic of functional blocks in a microprocessor IC 100, in accordance with some embodiments. Microprocessor die 100 includes a core 101, which further includes shift registers 103, arithmetic logic unit (ALU) 104 and a first level (L1) cache 105. Microprocessor IC 100 further includes a higher-level cache 102, external of core 101. Depending on implementation, higher-level cache 102 may be either L2 cache, or L3 cache if core 101 further comprises L2 cache. In some exemplary embodiments, the logic circuitry in core 101 (e.g., shift registers 103 and ALU 104) is implemented with metal-oxide-semiconductor transistors (MOSFETs), and more specifically complementary MOS (CMOS) that includes PMOS and NMOS transistors comprising stacked nanosheet channel regions. L1 cache 105 may be similarly implemented with stacked nanosheet MOSFETs, but is distinguished from logic circuitry as the FETs are configured into an array of static random-access memory (SRAM) bit-cells to store bits for processing, for example by shift registers 103 and ALU 104.

Figure 1B:
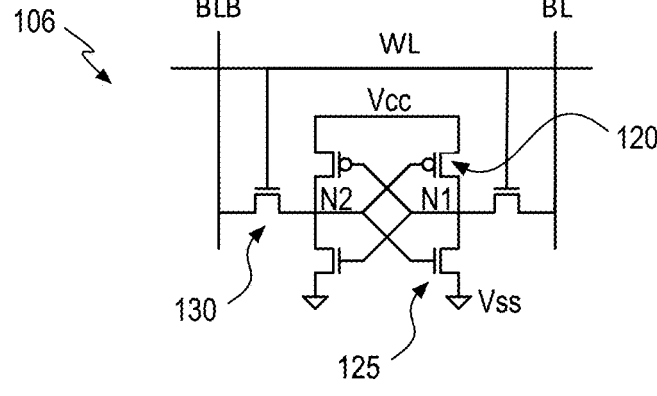
FIG. 1B illustrates a circuit diagram of a 6T SRAM cell, which is implemented in the microprocessor depicted in FIG. 1A in accordance with some embodiments.

FIG. 1B illustrates a circuit diagram of a 6T SRAM bit-cell 106, which may be arrayed within L1 cache 105 in accordance with some embodiments. SRAM bit-cell 106 includes six transistors comprising two p-channel (PMOS) load or "pull-up" transistors 120 and four n-channel (NMOS) transistors. The four NMOS transistors further comprise two drive or "pull-down" transistors 125 and two pass-gate, or access, transistors 130.

In accordance with exemplary embodiments, processor IC 100 is actively cooled with a chiller 110 coupled through fluid coolant loop 111. During operation of processor IC 100, chiller 110 is to maintain at least L1 cache 105 at a very low temperature, for example at least below 0° C., advantageously the below −50° C. and more advantageously within a cryogenic temperature operating window (e.g., about −180° C. to about −70° C.). While work load variation may result in thermal transients within the logic circuitry of core 101, L1 cache 105 may nevertheless be maintained at very low temperatures in a steady-state. Accordingly, the nanosheet MOS transistors in SRAM bit-cell 106 can sustain a substantial boost in performance relative to their operation at higher (e.g., >0° C.) temperatures. During very low temperature operation, stacked nanosheet NMOS transistors display increased carrier mobility and saturation velocity leading to substantially higher drive currents, as well as reduced leakage and parasitic resistances improving power efficiency and enabling lower voltage operation (e.g., 0.4V, or less). The various circuitry of core 101 may be synergistically designed to further enhance the performance microprocessor 100 beyond what would otherwise be achieved through transistor-level performance gains associated with being integrated into a very low temperature platform. As described further below, for example, SRAM cell 106 may be modified to further enhance the performance of L1 cache 105 beyond what can be achieved by merely operating SRAM cell 106 at a very low temperature.

Figure 2:
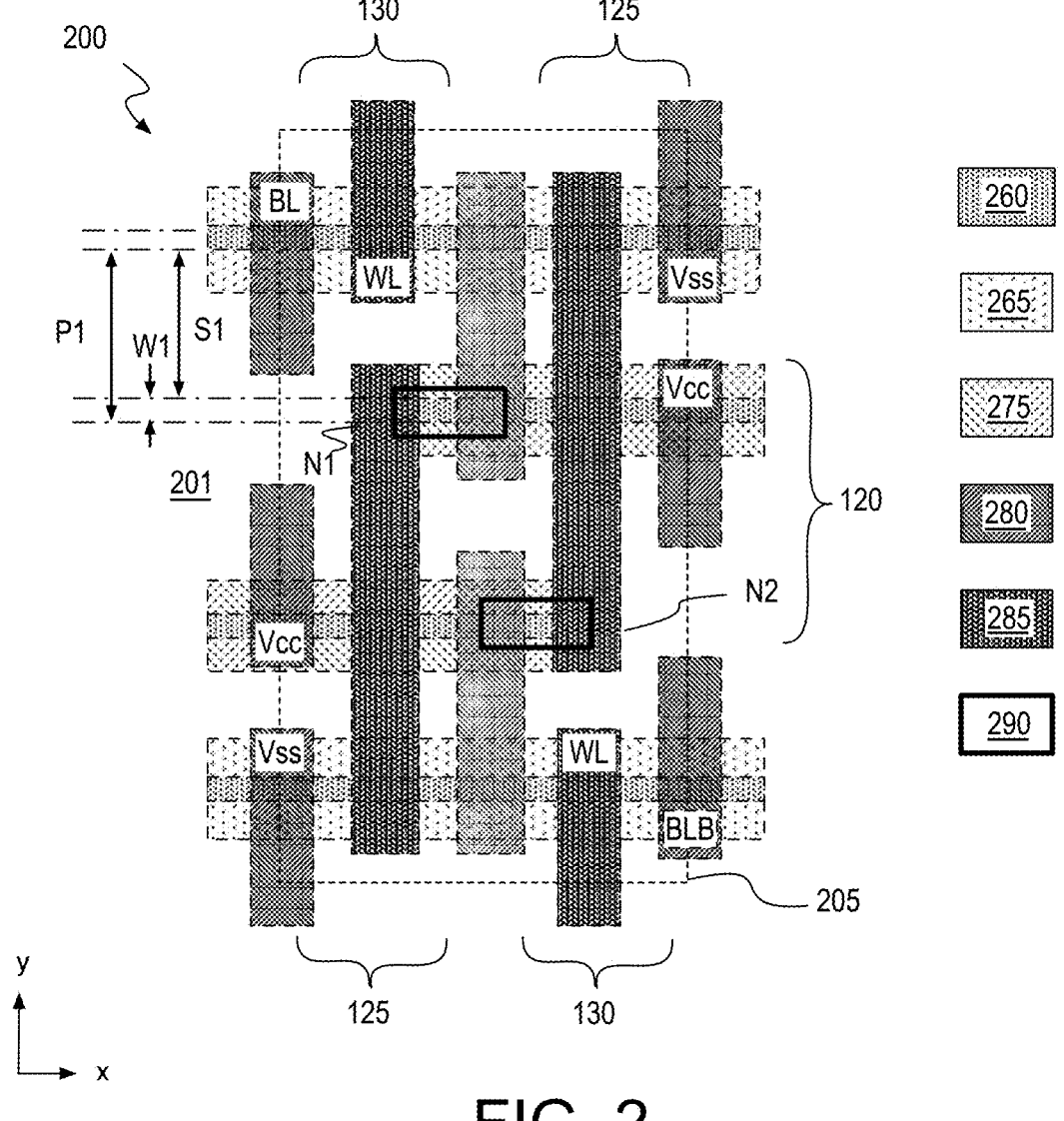
FIG. 2 is a layout of a 6T SRAM cell implementing the circuit diagram illustrated in FIG. 1B, in accordance with some embodiments.

FIG. 2 is a layout of a 6T SRAM bit-cell 200, in accordance with some embodiments where SRAM bit-cell 200 is to be maintained at a very low temperature during steady-state operation. In 6-T SRAM layout 200, pull-down transistor 125 and pass-gate transistor 130 include separate regions of a fin 260 that protrudes from a surface of an underlying substrate 201. Pull-up transistors 120 comprise two separate fins 260. Active regions 265 surrounding fins 260. Although not illustrated, source/drain regions may extend some width beyond a sidewall of fins 260 to overlap active regions 265. Both the source/drain regions and active regions 265 comprise semiconductor, which may be of complementary conductivity type (e.g., p-type active region 265 and n-type source/drain impurity regions) for inversion devices or of the same conductivity type (e.g., n-type active region 265 and n-type source/drain impurity regions) for accumulation devices. As shown, a first semiconductor terminal (e.g., source) of pull-down transistor 125 is coupled to Vss through a terminal contact metallization 280. A first semiconductor terminal (e.g., source) of pass-gate transistor 130 is coupled to a bitline BL through source/drain contact metallization 280.

In SRAM layout 200, source/drain contact metallization 280 is coupled to an interconnect metallization 290, which is further coupled to electrode 285. Interconnect metallization level 290 is illustrated in dark solid line to emphasize it is overlying the feature layers illustrated in dashed line. The gate electrode 285 of pass-gate transistor 130 is coupled to a wordline WL. A second semiconductor terminal (e.g., drain) of pull-down transistor 125 and a second semiconductor terminal (e.g., drain) of pass-gate transistor 130 are coupled through source/drain contact metallization 280 to one of the pull-up transistors 120. A gate electrode 285 of pull-down transistor 125 is coupled to pull-up transistors 120. In some examples where pass-gate transistors 130 and pull-down transistors 125 are both NMOS devices, pull-up transistors 120 are PMOS transistors comprising source/drain semiconductor (e.g., p-type) that is complementary to the source/drain semiconductor of transistors 125, 130.

In accordance with some embodiments, fins 260 are patterned to have a transverse width W1 that is significantly smaller than the analogous fin width for transistors within logic circuitry that is coupled to an SRAM including bit-cell 200. For example, comparable transistor fins within shift registers 103 (FIG. 1A) and/or ALU 104 may have a transverse width that significantly larger than width W1 (FIG. 2). Because of the higher transistor drive current possible at very low temperatures, width W1 may be smaller than what would otherwise be required for the pull-up/pull-down transistors to drive their loads and maintain bi-stable (0,1) states at the storage nodes N1 and N2. For nanoribbon transistors, drive current is a function of the number of nanoribbon channel regions stacked within a fin of a given transverse width. For embodiments where FETs in an SRAM have the same number of nanoribbon channel regions, fin width W1 of one or more drive or load transistors in bit-cell 200 may be less than fin widths within logic circuitry (e.g., shift register 103 and/or ALU 104 in FIG. 1A).

FIGS. 3A and 3B illustrate orthogonal cross-sections through fin 260 comprising a stacked nanosheet pull-up transistor 120 in the 6T SRAM bit-cell 200, in accordance with some embodiments. Referring first to FIG. 3A, fin 260 comprises nanoribbons 360A-360N, which are bodies of semiconductor material that extend through the channel region transistor 120. Along the pull-up channel length, gate electrode 285 clads a gate insulator 391. Gate insulator 391 further clads nanoribbons 360A-360N.

Gate insulator 391 may have a thickness less than 3 nm (e.g., 1.5-3.0 nm) and may include any number of material layers. In some exemplary embodiments, gate insulator 391 includes a thermal (chemical) oxide in addition to a high-k material. The chemical oxide may be present only on interfaces with nanoribbons 260A-260N. In some embodiments where nanoribbons are substantially pure silicon, the chemical oxide layer comprises predominantly silicon and oxygen. The chemical oxide may have any thickness, but in some examples is at least 1.0 nm. Gate insulator 391 may therefore be considered a stack of both a chemical oxide and a high-k material. The high-k material composition(s) may be any known to be suitable for a transistor gate insulator and that has a bulk relative permittivity greater than 8. One exemplary high-k material has a composition of $M1O_x$ where M1 is a transition or rare earth metal. Examples include a metal oxide comprising predominantly hafnium (e.g., $HfO_x$), a metal oxide comprising predominantly aluminum (e.g., $AlO_x$), a metal oxide comprising predominantly magnesium (e.g., MgO), a metal oxide comprising predominantly lanthanum (e.g., $LaO_x$), or a metal oxide comprising predominantly zirconium (e.g., $ZrO_x$).

In the example shown in FIG. 3A, nanoribbons 360A-360N extend through a dielectric spacer 311. In some embodiments, nanoribbons 360A-360N may also extend through impurity-doped semiconductor material 275 as denoted by dashed lines in FIG. 3A. In alternative embodiments, nanoribbons 260A-260N may be completely absent beyond dielectric spacer 311 with impurity-doped semiconductor material 275 then being a unitary body intervening between two separate stacks of nanoribbons 360A-360N.

As further shown in FIG. 3B, nanoribbons 360A-360N are semiconductor material layers within fin 260, which is over a material layer of substrate 201. In this example, fin 260 defines the dashed nanoribbon sidewalls 360. The slightly positive slope of sidewalls 360 results in each of nanoribbons 360A-360N having a somewhat trapezoidal slab profile representative of structural asymmetry associated with front-side transistor fabrication. Such asymmetry may be a result of nanoribbon sidewall 360 evolving during subtractive patterning of fin 260 into a stack of semiconductor materials, for example. Although nanoribbons 360A-360N are illustrated as having a transverse (y) width W1 that is greater than their vertical (z) thickness, nanoribbons 360A-360N may instead have a vertical thickness greater than, or substantially equal to, their transverse width W1. In some exemplary embodiments, transverse width W1 is less than 3 nm (e.g., 1-2 nm).

FIG. 3C illustrates a cross-sectional view through a stacked nanosheet transistor 390 that is representative of the transistors in a digital logic circuitry block of the microprocessor illustrated in FIG. 1A, in accordance with some embodiments. For example, stacked nanosheet transistor 390 may be a transistor of cascaded flip-flop in shift registers 103 or ALU 104 (FIG. 1A). As shown in FIG. 3C, stacked nanosheet transistor 390 has a transverse width W2 that is significantly larger than transverse width W1 of at least pull-up transistor 120. In some embodiments, transverse width W2 is no less than 3 nm (e.g., 3-4 nm). Transverse width W2 may therefore be two, or more, times transverse width W1. Noting that the transverse fin width of nanosheet transistors within an SRAM bit-cell may vary, for example between pass-gate transistors, pull-up transistors and/or pull-down transistors, at least a transistor of smallest transverse width within an SRAM bit-cell is significantly smaller than the transverse width of most transistors in a digital logic circuitry block within an IC. In further embodiments, even the transistor of greatest width within an SRAM bit-cell has a transverse width significantly smaller than the transverse width of most transistors in digital logic circuitry blocks of an IC.

In some further embodiments, the reduced transverse width W1 of one or more transistors within an SRAM cell enabled through a low-temperature implementation is leveraged to further improve SRAM performance with a concomitant reduction in bit-cell capacitance. In further reference to bit-cell 200 (FIG. 2), fins 260 have a pitch P1 comprising transverse width W1 and a spacing S1 between adjacent fins. In exemplary embodiments, the ratio of S1:W1 is larger within L1 cache 105 than for adjacent transistors within either of shift registers 103 or ALU 104 (FIG. 1A). In some embodiments, the ratio of fin spacing to transverse fin width (e.g., S1:W1) within L1 cache 105 is 2-3 times larger than within either (or both) of shift registers 103 or ALU 104 because of the difference between transverse widths W1 and W2 (FIG. 3A, 3B). Hence, rather than reducing the SRAM bit-cell height associated with cell boarder 205 to the extent allowed by the transistor fin width shrink afforded by implementing very low temperature operation, performance of the SRAM bit-cell may be further increased for a given bit-cell height by increasing the ratio of fin spacing to transverse fin width, which decreases parasitic capacitance.

In some embodiments, the advantages of very low temperature operation are leveraged by including fewer than the six transistors in an SRAM bit-cell. The lower performance of SRAM bit-cells having only four transistors, which has limited their commercial adoption, can be overcome in embodiments herein by integrating SRAMs comprising 4T bit-cells with an active cooling system capable of maintaining the bit-cell circuitry at very low temperatures (e.g., at least below $-25°$ C., and advantageously within the cryogenic temperature range).

FIG. 4A-4D illustrate circuit diagrams of 4T SRAM bit-cells, any one of which may be implemented in microprocessor 100 (FIG. 1A), for example. Generally, the illustrated 4T SRAM bit-cells lack pull-up transistors 120 of the 6T bit-cell circuit (FIG. 1B). The 4T SRAM bit-cells of 4A-4D are more specifically loadless designs.

Figure 4A:
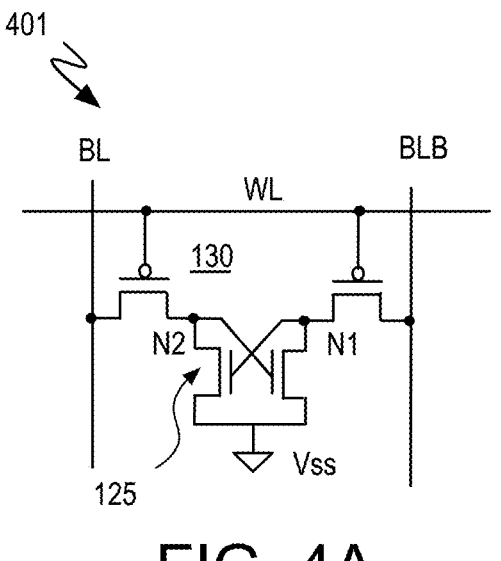
FIGS. 4A, 4B, 4C and 4D illustrate circuit diagrams of 4T SRAM cells, which may be implemented in the microprocessor depicted in FIG. 1A, in accordance with some embodiments.
Figure 4B:
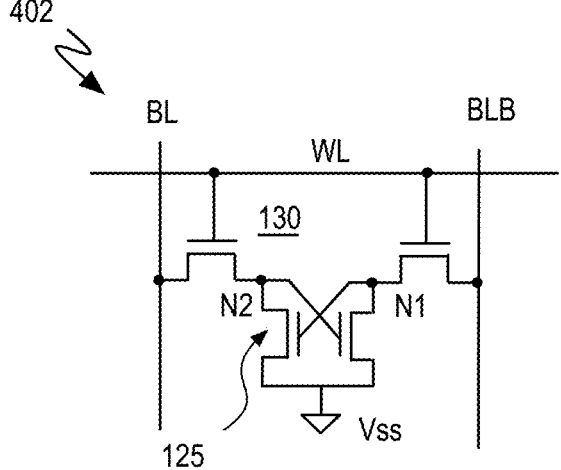
Figure 4C:
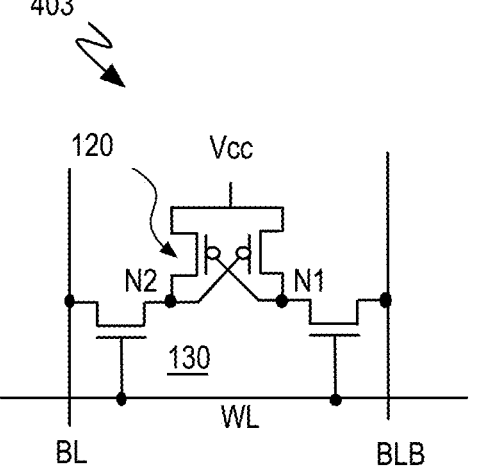
Figure 4D:
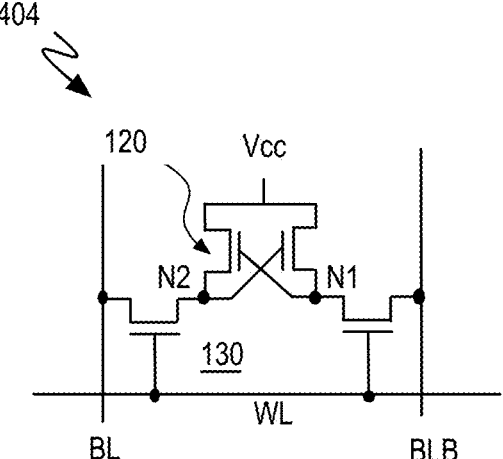

In FIG. 4A, bit-cell 401 comprises two access transistors 130 and two pull-down transistors 125. In this example, two access transistors 130 are PMOS while two pull-down transistors 125 are NMOS. In FIG. 4B, bit-cell 402 instead comprises two NMOS access transistors 130 and two NMOS pull-down transistors 125. During operation of bit-cells 401 or 402, bitlines BL and BLB may be pre-charged to Vcc. In FIG. 4C, bit-cell 403 comprises two NMOS access transistors 130 and two PMOS pull-up transistors 120. In FIG. 4D, bit-cell 404 instead comprises two NMOS access transistors 130 and two NMOS pull-up transistors 120. During operation of bit-cells 403 or 404, bitlines BL and BLB may be pre-charged to Vss.

Any of the 4T SRAM bit-cells 401-404 may benefit from advantageously high transistor drive currents, which may also facilitate their further implementation with fins and nanoribbons of a smaller transverse width (e.g., W1 of FIG. 3A). However, 4T SRAM bit-cells benefit most from the reduction in leakage currents possible with low temperature operation. With this reduction in leakage current, the performance of 4T SRAM bit-cells, such as any of those illustrated in FIG. 4A-4D, is much more comparable to 6T bit-cell circuits. An approximately 2.5× improvement in SRAM density may then be realized through the elimination of two transistors from each bit-cell without suffering a concomitant SRAM performance loss. Accordingly, a significant increase in SRAM density is uniquely possible for SRAMs integrated into a system capable of maintaining very low temperatures during operation.

Figure 5A:
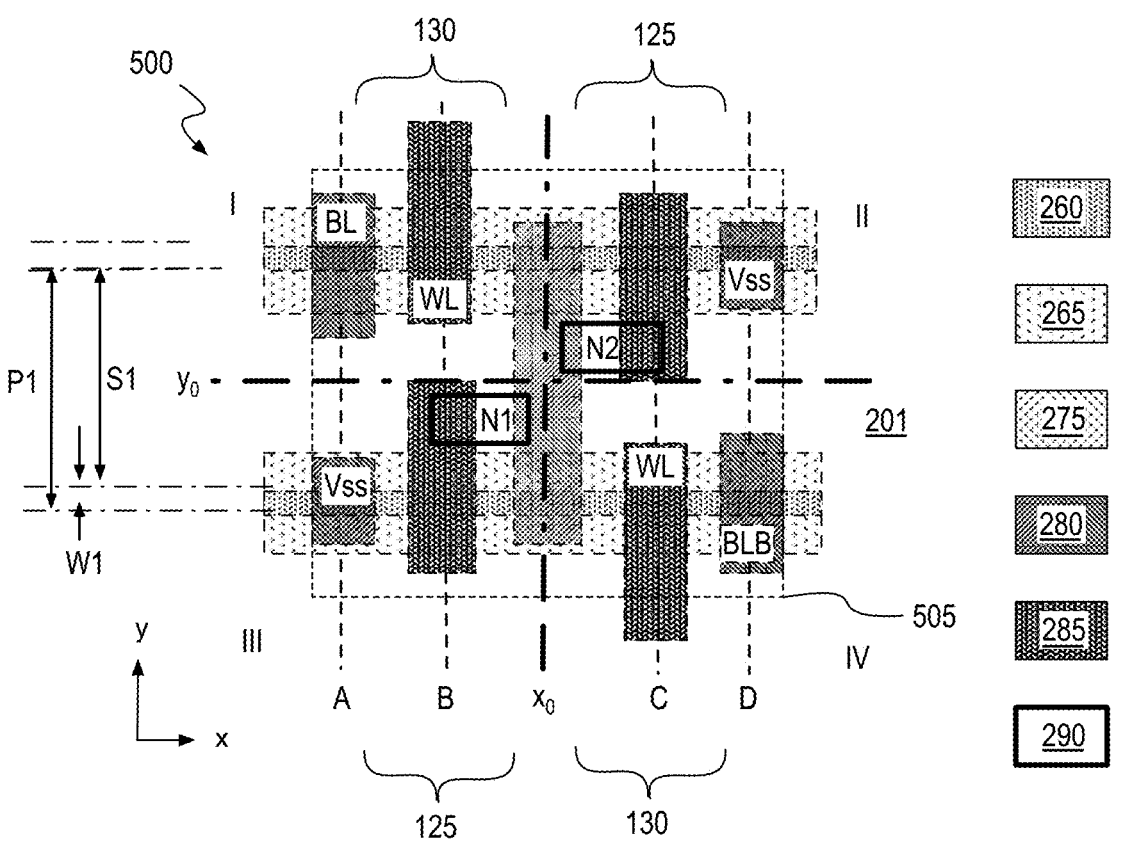
FIG. 5A is a layout of an NMOS 4T SRAM cell implementing the circuit diagram illustrated in FIG. 4B, in accordance with some embodiments.

The performance benefits of very low temperature operation are more dramatic for electrons than holes as a function of their mobility and/or saturation velocity being more greatly enhanced. Accordingly, 4T SRAM cells comprising only NMOS transistors (e.g., 4T SRAM bit-cells 402 and 404) are particularly advantageous to integrate into circuitry, such as microprocessor 100 (FIG. 1A), that is part of a low-temperature platform. FIG. 5A is a layout of a 4T SRAM bit-cell 500 implementing the bit-cell circuit 402 illustrated in FIG. 4B, in accordance with some NMOS embodiments.

Figure 5B:
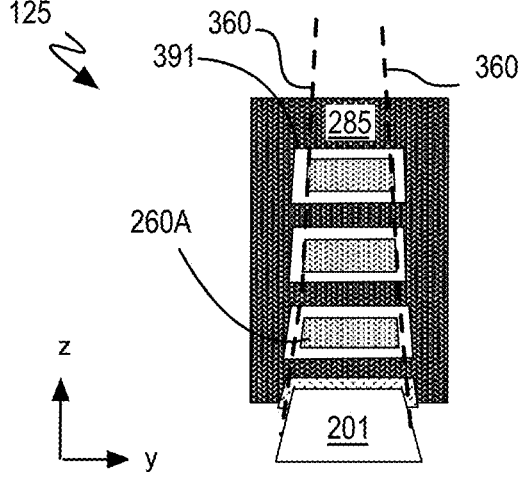
FIG. 5B illustrates a cross-section through a stacked nanosheet transistor fin within the 4T SRAM cell illustrated in FIG. 5A, in accordance with some embodiments.

As shown in FIG. 5A, 4T SRAM bit-cell 500 includes only two fins 260. Fins 260 are substantially parallel, each having a longitudinal length in one (e.g., x) direction over a plane of substrate 201 that spans the width of cell boarder 505. Because all four transistors are NMOS, there are only two active regions 265, each surrounding one of fins 260. Within bit-cell 500, each of fins 260 comprises nanoribbons 260A-260N for one access transistor 125 and for one pull-down transistor 125. FIG. 5B further illustrates a cross-sectional view through pull-down transistor 125 along a longitudinal length of gate electrode 285 coincident with the y-axis, which intersects the stacked nanoribbons 260A-260N, substantially as described above for pull-up transistor 120.

As further illustrated in FIG. 5A, each of the pair of pull-down transistors 125 and pair of access transistors 130 have a gate electrode with a longitudinal length extending in one direction orthogonal to that of fins 260 (e.g., y-direction). A gate electrode 285 of a first pull-down transistor 125 has a centerline B through a thickness of gate electrode 285 substantially orthogonal to the x-y plane of substrate material 201. Centerline B passes through another gate electrode 285 of one access transistor 130, which is colinear with a first pull-down transistor 125. Bit-cell boarder 205 is bifurcated in the x-dimension by a straight line $y_0$, which passes through a space between these two colinear gate electrodes 285. A gate electrode 285 of the second pull-down transistor 125 has another centerline C through the thickness of gate electrode 285 orthogonal to the x-y plane of substrate material 201. Centerline C passes through a gate electrode 285 of the second access transistor 130, which is colinear with the second pull-down transistor 125. Bit-cell bifurcation line $y_0$ also passes through a space between these two colinear gate electrodes 285.

Individual ones of the pair of pull-down transistors 125 and pair of access transistors 130 have source/drain contact metallization that also has a longitudinal length extending in one direction orthogonal to that of fins 260 and parallel to gate electrodes 285 (e.g., y-direction). Bit-cell boarder 505 may be bifurcated in the y-dimension by a straight line $x_0$, which passes through a centerline of a stripe of source/drain contact metallization 280 that intersects both fins 260 and spans the space between fins 260. This center stripe of source/drain contact metallization 280 is in direct contact with a source/drain of both pull-down transistors 125 and a drain/source of both access transistors 130. The center stripe of source/drain contact metallization 280 is electrically coupled to gate electrode 285 of each pull-down transistor 125 through interconnect metallization 290, defining storage nodes N1, N2. Cell bifurcation line $x_0$ passes through a space between these two features of storage node interconnect metallization 290. Cell bifurcation line $y_0$ also passes through a space between these two features of storage node interconnect metallization 290.

As further illustrated in FIG. 5A, each of the pair of pull-down transistors 125 and access transistors 130 have a second source/drain that is in contact with one feature of source/drain contact metallization 280. A first pair of these features of source/drain contact metallization 280 are colinear, sharing a centerline A that extends through a thickness of the source/drain contact metallization 280. A second pair of these features of source/drain contact metallization 280 are colinear and share centerline D. Cell bifurcation line $y_0$ passes through a space between each pair of colinear features of source/drain contact metallization 280. Bitline BL is coupled into one access transistor 130 through one feature of source/drain contact metallization 280 on centerline A. Bitline bar BLB is coupled into a second access transistor 130 through one feature of source/drain contact metallization 280 on centerline D. Vss is coupled into one pull-down transistor 125 through one feature of source/drain contact metallization 280 on centerline A and into a second access transistor 130 through one feature of source/drain contact metallization 280 on centerline D. Centerlines A, B, C and D are all substantially parallel and advantageously at an equal pitch.

Accordingly, the bit-cell bifurcation lines $x_0$ and $y_0$ define four quadrants I, II, III and IV of bit-cell 500. Quadrants I and IV are mirror images of each other along a first plane of symmetry orthogonal to a plane of substrate 201 that passes through the intersection of the bit-cell bifurcation lines $x_0$ and $y_0$. Quadrants II and III are similarly mirror images of each other along a second plane of symmetry also passing through the intersection of the bit-cell bifurcation lines $x_0$ and $y_0$ and orthogonal to the first plane of symmetry. In other words, the four quadrants I-IV of bit-cell 500 have 180° rotational symmetry.

Notably, the area within bit-cell boarder 505 is approximately 2.5×smaller than the area within bit-cell boarder 205 (FIG. 2), which translates into an approximate 2.5×improvement in SRAM cell density for given minimum feature size and space design rule. For further embodiments where SRAM bit-cell 500 is implemented into a system with sufficient active cooling to maintain at least SRAM bit-cell 500 at a very low temperature (e.g., <<0° C.), leakage losses of SRAM bit-cell 500 are no worse than those of SRAM bit-cell 200 so that the density improvement between a 6T bit-cell and a 4T bit-cell is not at the expense of SRAM leakage performance.

In some further embodiments, the same reductions in the transverse width of fins 260 described above in the context of 6T SRAM bit-cell 200 may be implemented in 4T SRAM bit-cell 500, for example to leverage the higher transistor drive currents possible at very low temperatures into lower bit-cell capacitance for a given bit-cell height. For example, pitch P1 may comprise a larger space S1 as transverse width W1 is reduced. The smaller transverse width W1 may be reduced to be significantly smaller than the transverse width of transistors in logic circuitry blocks outside of an SRAM array. For example, within SRAM bit-cell 500 transverse width W1 may be 1-2 nm while the equivalent width within logic circuitry is 3-4 nm.

Figure 6:
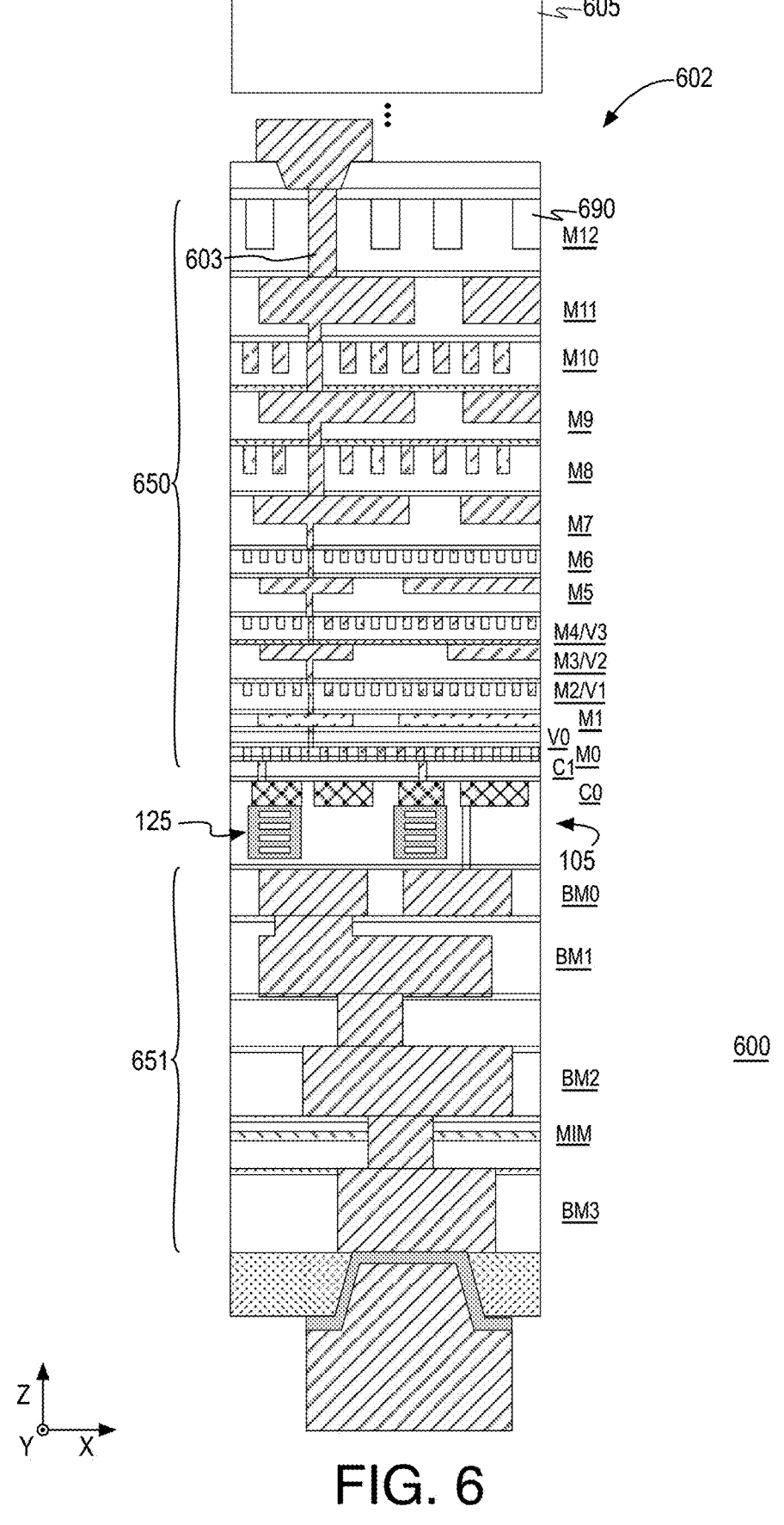
FIG. 6 illustrates a cross-sectional view of a low-temperature integrated circuit system with die-level active liquid phase cooling, in accordance with some embodiments.

FIG. 6 illustrates a cross-sectional view of a low temperature integrated circuit system 600 with die-level active liquid phase cooling, in accordance with some embodiments. In IC system 600, IC die 602 includes liquid coolant conveyance structures or components to otherwise remove heat from IC die 602 to achieve a very low operating temperature, for example at or below 0° C., for at least an L1 cache comprising SRAM.

In IC system 600, IC die 602 includes die level active liquid cooling as provided by microchannels 690. Microchannels 690 are to convey a heat transfer fluid to remove heat from IC die 602. The heat transfer fluid may be any suitable liquid or gas. In some embodiments, the heat transfer fluid has an operating window of at least −45° C. and preferably a cryogenic temperature operating window (e.g., about −70° C. to about −180° C.). In some embodiments, microchannels 690 are to convey liquid nitrogen operable to lower the temperature of at least a portion of IC die 602 to an operating temperature below −50° C. In some other embodiments, the microchannels 690 are to convey one of helium-3, helium-4, hydrogen, neon, air, fluorine, argon, oxygen, or methane.

IC die 602 may include multiple microchannels 690 providing discrete channels or a network of interconnected channels. Microchannels 690 may have any pattern in the x-y plane such as a serpentine pattern, or the like. Microchannels 690 may be routed over an entirety of IC die 602 at some uniform density. Alternatively, microchannels 690 may be routed more densely over one portion of IC die 602, such as an SRAM portion of IC die 602, than another portion of IC die 602, such as a logic portion of IC die 602. Microchannels 690 place IC die 602 in fluid communication with a heat exchanger (not shown) external to IC die 602 that removes heat from the heat transfer fluid before its recirculation through microchannels 690. The flow of fluid within microchannels 690 may be maintained by a pump or other means to provide a pressure differential between opposite ends of microchannels 690. The operation of a heat exchanger, pump, etc. may be controlled by a controller, for example.

In the illustrated embodiment, microchannels 690 are implemented at a metallization level M12. Metallization levels M0 through M11 may accordingly comprise and IC interconnect structure portion 650 over a first side of an SRAM pull-down transistor 125 in L1 cache 105. Maintained at potentially cryogenic temperatures, drive current of pull-down transistor 125 may be far superior to the drive current possible at standard temperature, or above.

Microchannels 690 may be formed using any suitable technique(s), such as patterning and etch techniques to form voids followed by deposition, lamination, or bonding techniques to enclose the voids. Microchannels 690 may be adjacent to a metallization feature 603, which may be an interface to a package level interconnect structure associated with a package 605. As shown in FIG. 6, levels of interconnect metallization features M0-M12 are over a front side of a device layer comprising at least pull-down transistor 125. Backside metallization levels 651 (e.g., BM0-BM3) are over a backside of device the device layer and may couple electrical power into IC die 602, for example.

Figure 7:
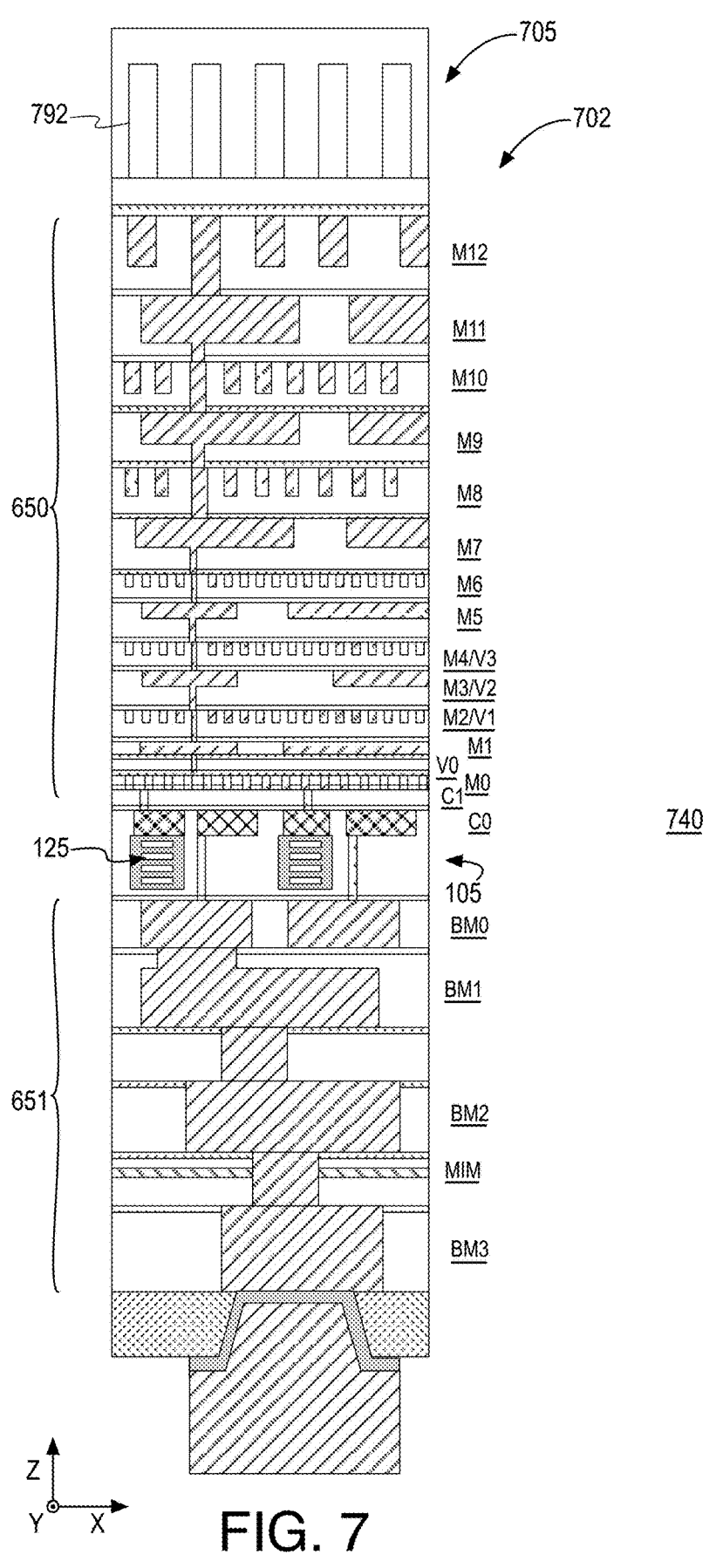
FIG. 7 illustrates a cross-sectional view of a low-temperature integrated circuit system with package-level active liquid phase cooling, in accordance with some embodiments.

FIG. 7 illustrates a cross-sectional view of a low temperature integrated circuit system 740 with package-level active liquid phase cooling, in accordance with some embodiments. In IC system 740, IC die 702 includes active cooling structures or components to remove heat from IC die 702 to achieve a steady-state operating temperature within at least some portion of IC die 702 at or below a very low temperature such as −25° C. or any other operating or target temperature discussed herein.

In IC system 740, IC die package 705 includes a liquid cooling structure having microchannels 792. Microchannels 792 are to similarly convey a heat transfer fluid to remove heat from IC die 702. The heat transfer fluid may be any of the liquid or gas examples described as suitable for microchannels 792. Microchannels 792 are to couple to a heat exchanger (not shown) external of IC die package 705. In the illustrated embodiment, package cooling structure 705 is an active chiller that may be operable at cryogenic temperatures and mounted to IC die 702 according to any suitable techniques, such as a bonding or solder interconnection.

Figure 8:
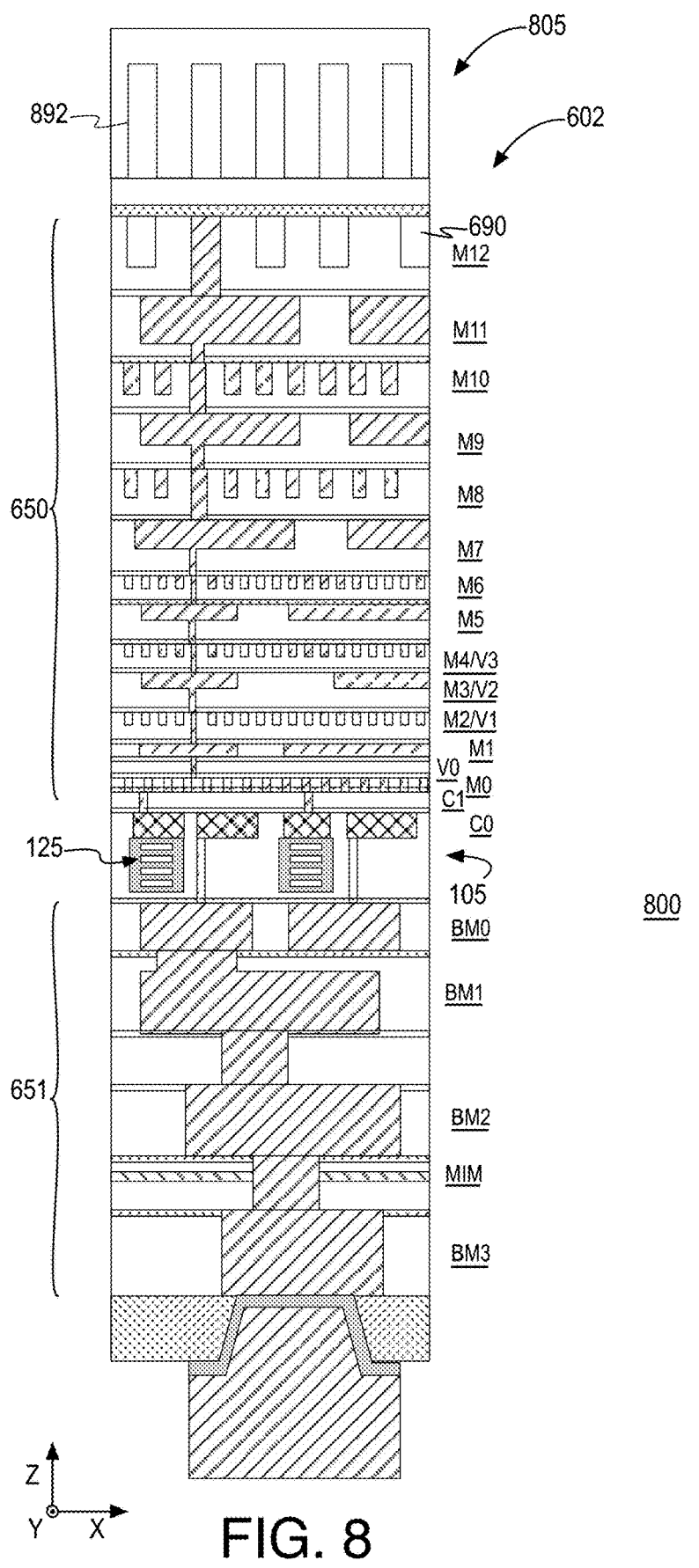
FIG. 8 illustrates a cross-sectional view of a low-temperature integrated circuit system with die-level and package-level active liquid phase cooling, in accordance with some embodiments.

FIG. 8 illustrates a cross-sectional view of a low temperature integrated circuit system 800 having both die-level and package-level active liquid phase cooling, in accordance with embodiments. In IC system 800, IC die 602 includes active cooling structures or components as provided by both microchannels 690 and package cooling structure 805. In some embodiments, the heat transfer fluid deployed in microchannels 690 and microchannels 892 are coupled to the same pump and heat exchanger systems. In such embodiments, the heat transfer fluid conveyed in microchannels 690 and 892 are part of the same active cooling loop. In other embodiments, the heat transfer fluids in each of microchannels 690 and 892 are maintained as separate active cooling loops.

Figure 9:
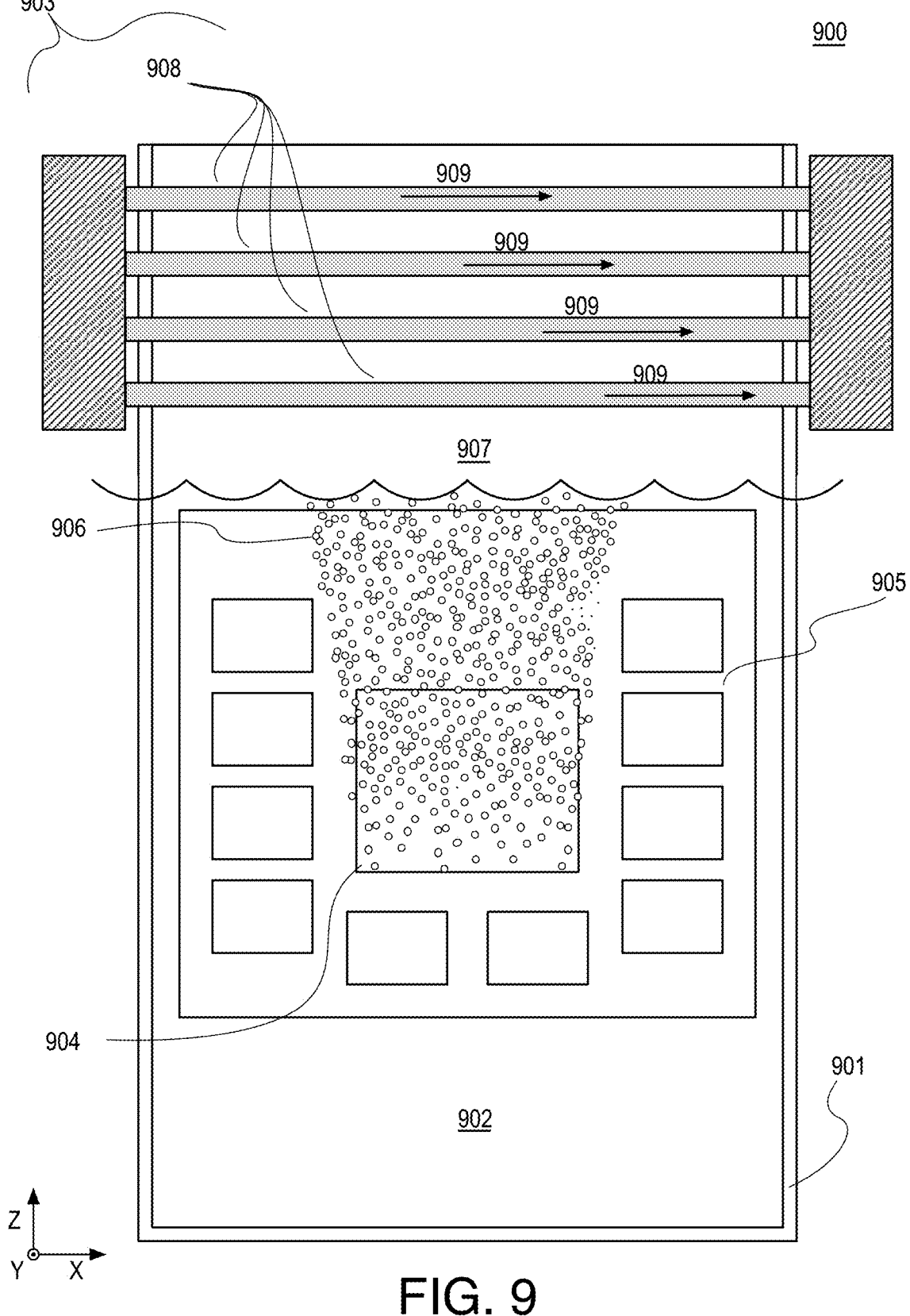
FIG. 9 illustrates a schematic of a liquid phase immersion cooling system for cryogenic operation of an integrated circuit die comprising SRAM bit cells in accordance with some embodiments.

FIG. 9 illustrates a schematic of a liquid phase immersion cooling system 900 for cryogenic operation of an integrated circuit die comprising an L1 cache comprising bit-cells in accordance with one or more embodiments described elsewhere herein. As shown, two-phase immersion cooling system 900 includes a fluid containment structure 901, a low-boiling point liquid 902 within fluid containment structure 901, and a condensation structure 903 at least partially within fluid containment structure 901. As used herein, the term low-boiling point liquid indicates a liquid having a boiling point in the very low (e.g., cryogenic) temperature ranges above. In some embodiments, the low-boiling point liquid is one of nitrogen (LN2), helium-3, helium-4, hydrogen, neon, air, fluorine, argon, oxygen, or methane.

In operation, a heat source 904 (such as an IC die or any of IC systems 600, 740, or 800 described above) is immersed in low-boiling point liquid 902. In some embodiments, IC die or IC systems deployed in two-phase immersion cooling system 900 do not include fluid microchannels. In alternative embodiments, such die-level or package-level active cooling structures may be used in concert with two-phase immersion cooling system 900. Hence, an IC die having an L1 cache with SRAM bit-cells, for example as described elsewhere herein, may be attached to a host substrate 905. Host substrate 905 may be coupled to a power supply (not shown) and may be partially or completely submerged in low-boiling point liquid 902.

In operation, the heat produced by heat source 904 vaporizes low-boiling point liquid 902 illustrated as bubbles 906, which may collect as a vapor portion 907 within fluid containment structure 901. Condensation structure 903 may extend through vapor portion 907. In some embodiments, condensation structure 903 is a heat exchanger having tubes 908 with a cooling fluid (i.e., a fluid colder than the condensation point of vapor portion 907) flow 909 through tubes 908 to condense vapor portion 907 back to low-boiling point liquid 902.

Figure 10:
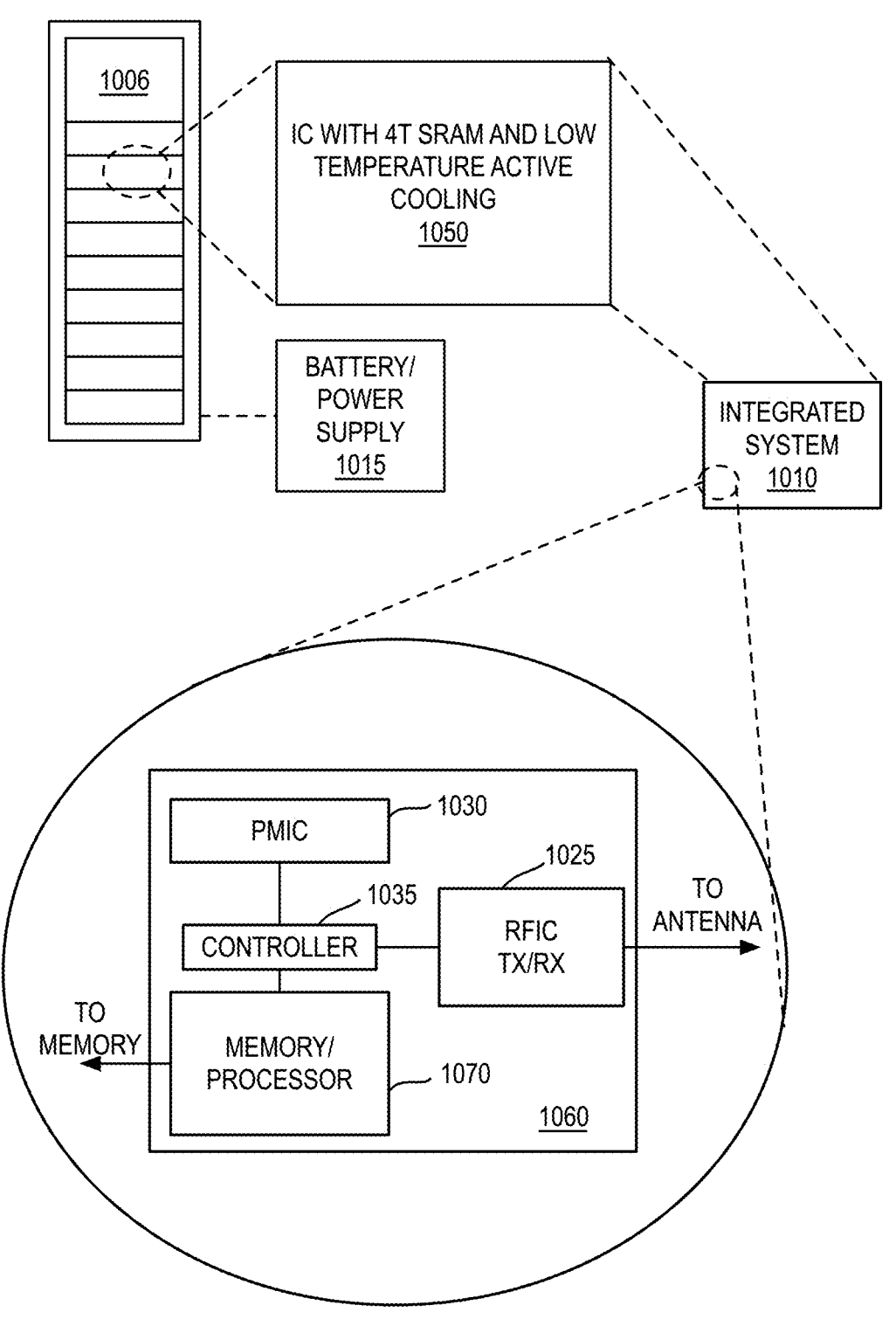
FIG. 10 illustrates a schematic of a data server machine including an actively liquid-phase cooled integrated circuit comprising SRAM bit cells in accordance with some embodiments.

FIG. 10 illustrates a schematic of a data server machine including an active liquid-phase cooled integrated circuit with a L1 cache comprising SRAM bit-cells in accordance with one or more embodiments described elsewhere herein. Server machine 1006 may be any commercial server, for example, including any number of high-performance computing platforms disposed within a rack and networked together for electronic data processing, which in the exemplary embodiment includes one or more devices 1050 having an integrated circuit that includes 4T or 6T SRAM bit-cells, and low temperature active cooling operable to remove heat from the integrated circuit to achieve any low operating temperature discussed herein for at least the SRAM bit-cells.

Also as shown, server machine 1006 includes a battery and/or power supply 1015 to provide power to devices 1050, and to provide, in some embodiments power delivery functions such as power regulation. Devices 1050 may be deployed as part of a package-level integrated system 1010.

In the exemplary embodiment, integrated system 1010 includes an integrated circuitry 1070 (labeled "Memory/Processor") includes at least one memory array (e.g., RAM), and/or at least one processor core (e.g., a microprocessor, a multi-core microprocessor, or graphics processor, or the like) having the characteristics discussed herein. In an embodiment, integrated circuitry 1070 is a microprocessor including an SRAM L1 cache memory. Integrated circuitry 1070 may be further coupled to (e.g., communicatively coupled to) a board, a substrate, or an interposer 1060 along with, one or more of a power management integrated circuit (PMIC) 1030, RF (wireless) integrated circuitry (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller 1035.

Figure 11:
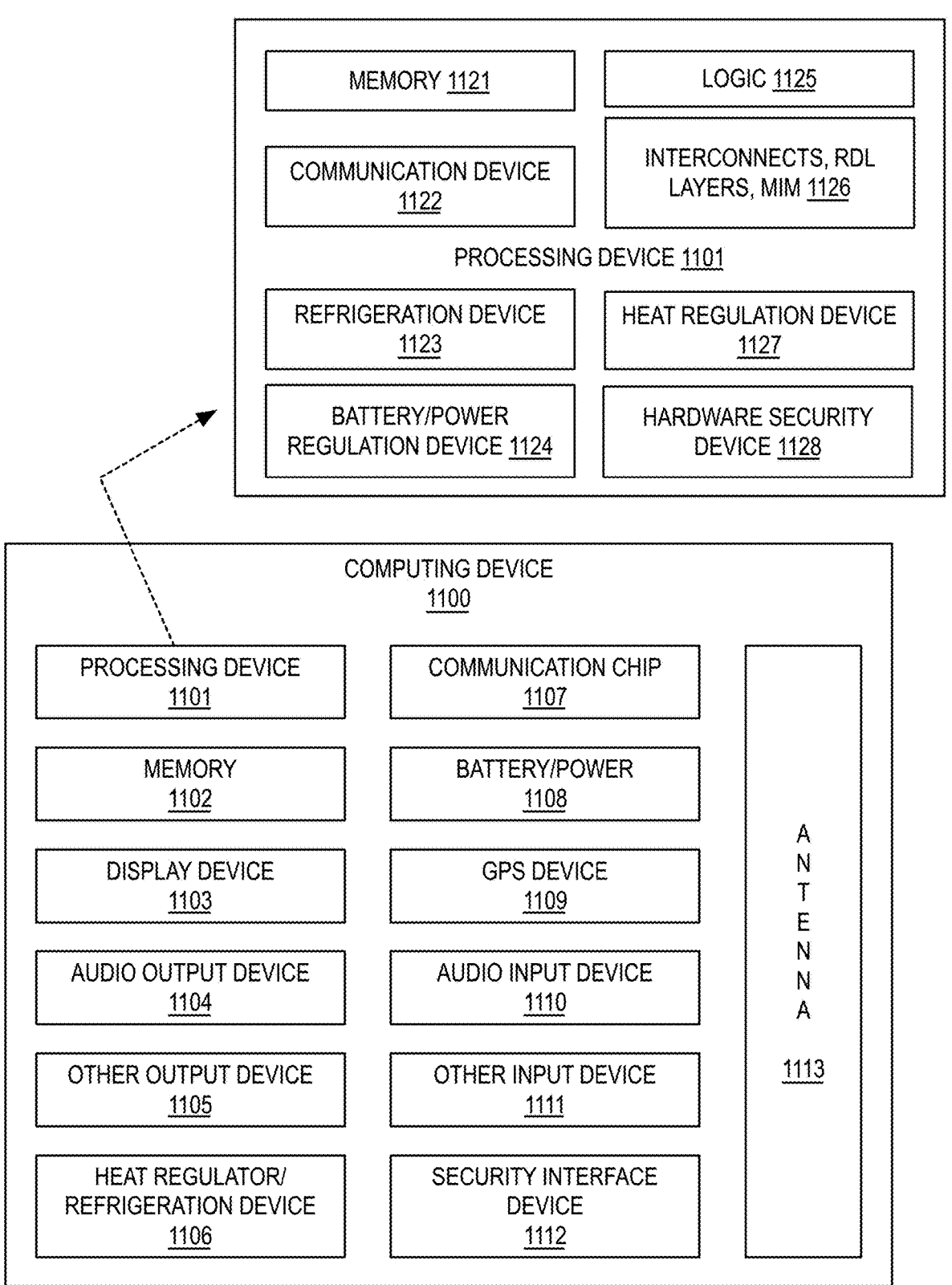
FIG. 11 is a block diagram of a cryogenically cooled computing device in accordance with some embodiments.

FIG. 11 is a block diagram of a cryogenically cooled computing device 1100 in accordance with some embodiments. For example, one or more components of computing device 1100 may include any of the devices or structures discussed elsewhere herein. Exemplary components are illustrated in FIG. 11 as included in computing device 11300, but any one or more of these components may be omitted or duplicated, as suitable for the application. In some embodiments, some of the components included in computing device 1100 may be attached to one or more printed circuit boards (e.g., a motherboard). In some embodiments, various ones of these components may be fabricated onto a single system-on-a-chip (SoC) die. Additionally, in various embodiments, computing device 1100 may not include one or more of the components illustrated in FIG. 11, but computing device 1100 may include interface circuitry for coupling to the one or more components. For example, computing device 1100 may not include a display device 1103, but may include display device interface circuitry (e.g., a connector and driver circuitry) to which display device 1103 may be coupled.

Computing device 1100 may include a processing device 1101 (e.g., one or more processing devices). As used herein, the term processing device or processor indicates a device that processes electronic data from registers and/or memory to transform that electronic data into other electronic data that may be stored in registers and/or memory. Processing device 1101 may include a memory 1121, a communication device 1122, a refrigeration/active cooling device 1123, a battery/power regulation device 1124, logic 1125, interconnects 1126 (i.e., optionally including redistribution layers (RDL) or metal-insulator-metal (MIM) devices), a heat regulation device 1127, and a hardware security device 1128.

Processing device 1101 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 1101 may include a memory 1102, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1121 includes memory that shares a die with processing device 1102. This memory may be used as cache memory and may include embedded dynamic random-access memory (eDRAM) or spin transfer torque magnetic random-access memory (STT-M RAM).

Computing device 1100 may include a heat regulation/refrigeration device 1106. Heat regulation/refrigeration device 1106 may maintain processing device 1102 (and/or other components of computing device 1100) at a predetermined low temperature during operation. This predetermined low temperature may be any temperature discussed elsewhere herein.

In some embodiments, computing device 1100 may include a communication chip 1107 (e.g., one or more communication chips). For example, the communication chip 1107 may be configured for managing wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a nonsolid medium.

Communication chip 1107 may implement any wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project, etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1107 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1107 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1107 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 4G, 5G, and beyond. Communication chip 1107 may operate in accordance with other wireless protocols in other embodiments. Computing device 1100 may include an antenna 1113 to facilitate wireless communications and/or to receive other wireless communications (such as AM or FM radio transmissions).

In some embodiments, communication chip 1107 may manage wired communications, such as electrical, optical, or any other suitable communication protocols (e.g., the Ethernet). As noted above, communication chip 1107 may include multiple communication chips. For instance, a first communication chip 1107 may be dedicated to shorter-range wireless communications such as Wi-Fi or Bluetooth, and a second communication chip 1107 may be dedicated to longer-range wireless communications such as GPS, EDGE, GPRS, CDMA, WiMAX, LTE, EV-DO, or others. In some embodiments, a first communication chip 1107 may be dedicated to wireless communications, and a second communication chip 1107 may be dedicated to wired communications.

Computing device 1100 may include battery/power circuitry 1108. Battery/power circuitry 1108 may include one or more energy storage devices (e.g., batteries or capacitors) and/or circuitry for coupling components of computing device 1100 to an energy source separate from computing device 1100 (e.g., AC line power).

Computing device 1100 may include a display device 1103 (or corresponding interface circuitry, as discussed above). Display device 1103 may include any visual indicators, such as a heads-up display, a computer monitor, a projector, a touchscreen display, a liquid crystal display (LCD), a light-emitting diode display, or a flat panel display, for example.

Computing device 1100 may include an audio output device 1104 (or corresponding interface circuitry, as discussed above). Audio output device 1104 may include any device that generates an audible indicator, such as speakers, headsets, or earbuds, for example.

Computing device 1100 may include an audio input device 1110 (or corresponding interface circuitry, as discussed above). Audio input device 1110 may include any device that generates a signal representative of a sound, such as microphones, microphone arrays, or digital instruments (e.g., instruments having a musical instrument digital interface (MIDI) output).

Computing device 1100 may include a global positioning system (GPS) device 1109 (or corresponding interface circuitry, as discussed above). GPS device 1109 may be in communication with a satellite-based system and may receive a location of computing device 1100, as known in the art.

Computing device 1100 may include another output device 1105 (or corresponding interface circuitry, as discussed above). Examples include an audio codec, a video codec, a printer, a wired or wireless transmitter for providing information to other devices, or an additional storage device.

Computing device 1100 may include another input device 1111 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1100 may include a security interface device 1112. Security interface device 1112 may include any device that provides security measures for computing device 1100 such as intrusion detection, biometric validation, security encode or decode, managing access lists, malware detection, or spyware detection, Computing device 1100, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

It will be recognized that embodiments are not limited to the specific examples described, but can be practiced with modification and alteration without departing from the scope of the appended claims. For example, the above embodiments may include specific combinations of features as further provided below.

In first examples, a static random-access memory (SRAM) bit-cell with no more than four transistors. Each of the transistors comprise a stack of channel regions, and the four transistors comprise two NMOS access transistors and two NMOS pull-down transistors. The bit-cell comprises no more than two substantially parallel fins having first longitudinal lengths in a first direction, individual ones the fins comprising the stack of channel regions for one of the access transistors and for one of the pull-down transistors. The four transistors comprise gate electrodes having second longitudinal lengths in a second direction, orthogonal to the first direction. A centerline passing through a thickness of the gate electrode of a first of the access transistors is substantially colinear with a centerline passing through a thickness of the gate electrode of a first of the pull-down transistors.

In second examples, for any of the first examples a centerline passing through a thickness of the gate electrode of a second of the access transistors is substantially colinear with a centerline passing through a thickness of the gate electrode of a second of the pull-down transistors.

In third examples, for any of the first through second examples the four transistors comprise source/drain contact metallization having third longitudinal lengths in the second direction A first source/drain contact metallization of the first of the pull-down transistors and a first source/drain contact metallization of the second of the pull-down transistors comprise a single contiguous stripe of metallization spanning a width of the fins and a space therebetween.

In fourth examples, for any of the third examples a centerline passing through a thickness of a second source/drain contact metallization of the first of the pull-down transistors is substantially colinear with a centerline passing through a thickness of a second source/drain contact metallization of the first of the access transistors. A centerline passing through a thickness of a second source/drain contact metallization of the second of the pull-down transistors is substantially colinear with a centerline passing through a thickness of a second source/drain contact metallization of the second of the access transistors.

In fifth examples, for any of the first through fourth examples the IC die further comprises an integrated cooling structure to maintain the SRAM bit-cell at a temperature below −25° C. during steady-state operation of the SRAM bit-cell.

In sixth examples, a computer system comprises an integrated circuit (IC) die, arithmetic logic unit (ALU) circuitry, and a static random-access memory (SRAM). A bit-cell of the SRAM comprises no more than four transistors, the transistors each comprising a stack of channel regions. The system comprises an integrated cooling structure to maintain at least the SRAM is at a temperature below −25° C. during steady state operation of the SRAM.

In seventh examples, for any of the sixth examples the integrated cooling structure comprises a plurality of microchannels within the IC die, the microchannels to convey a heat transfer liquid that maintains the SRAM at a temperature below −50° C.

In eighth examples, for any of the sixth through seventh examples the four transistors comprise two NMOS access transistors and two NMOS pull-down transistors.

In ninth examples, for any of the sixth through eighth examples the bit-cell consists of two substantially parallel fins having first longitudinal lengths in a first direction, individual ones the fins comprising the stack of channel regions for one of the access transistors and for one of the pull-down transistors. The four transistors comprise gate electrodes having second longitudinal lengths in a second direction, orthogonal to the first direction. A centerline passing through a thickness of the gate electrode of a first of the access transistors is substantially colinear with a centerline passing through a thickness of the gate electrode of a first of the pull-down transistors. A centerline passing through a thickness of the gate electrode of a second of the access transistors is substantially colinear with a centerline passing through a thickness of the gate electrode of a second of the pull-down transistors.

In tenth examples, for any of the sixth through eighth examples the four transistors comprise source/drain contact metallization having third longitudinal lengths in the second direction. A first source/drain contact metallization of the first of the pull-down transistors and a first source/drain contact metallization of the second of the pull-down transistors comprise a single contiguous stripe of metallization spanning the fins and a space therebetween. A centerline passing through a thickness of a second source/drain contact metallization of the first of the pull-down transistors is substantially colinear with a centerline passing through a thickness of a second source/drain contact metallization of the first of the access transistors. A centerline passing through a thickness of a second source/drain contact metallization of the second of the pull-down transistors is substantially colinear with a centerline passing through a thickness of a second source/drain contact metallization of the second of the access transistors.

In eleventh examples, for any of the sixth through tenth examples the transistors are first transistors, and the channel regions are first channel regions. The ALU circuitry comprises a plurality of second transistors, each comprising a stack of second channel regions. A first width of the first channel regions is less than a second width of the second channel regions.

In twelfth examples, for any of the eleventh examples the first width is less than 3 nm and the second width is over 4 nm.

In thirteenth examples, for any of the eleventh through twelfth examples the first transistors have a pitch that is at least twice that of the second transistors.

In fourteenth examples, for any of the sixth through thirteenth examples the system further comprises a power supply coupled with the IC die to power the IC die during operation.

In fifteenth examples, a method of fabricating an IC die comprises forming a static random-access memory (SRAM) bit-cell with no more than four transistors, each of the transistors comprising a stack of channel regions. Forming the SRAM comprises forming two substantially parallel fins having first longitudinal lengths in a first direction, individual ones the fins comprising the stack of channel regions for only one access transistor and one pull-down transistor. The method comprises forming four gate electrodes, each having second longitudinal lengths in a second direction, orthogonal to the first direction. A centerline of the gate electrode of a first access transistors is substantially colinear with a centerline of the gate electrode of a first pull-down transistor. A centerline of the gate electrode of a second access transistor is substantially colinear with a centerline of the gate electrode of second of the pull-down transistor.

In sixteenth examples, for any of the fifteenth examples the method comprises forming microchannels within the integrated circuit (IC) die, the microchannels to convey a liquid at a temperature of less than −50° C.

In seventeenth examples, for any of the fifteenth through sixteenth examples the forming comprises forming a single contiguous stripe of contact metallization spanning the fins and a space therebetween, the stripe of contact metallization in contact with a first source/drain of a first pull-down transistor and a first source/drain of a second pull-down transistor.

In eighteenth examples, for any of the fifteenth through seventeenth examples forming the SRAM comprises forming a second contact metallization feature in contact with a second source/drain of the first pull-down transistor and a third contact metallization feature in contact with a source/drain of a first access transistor, wherein a centerline passing through a thickness of the second contact metallization feature is colinear with a centerline passing through a thickness of the third contact metallization feature.

In nineteenth examples, for any of the fifteenth through eighteenth examples forming the SRAM comprises forming a fourth contact metallization feature in contact with a second source/drain of the second pull-down transistor and a fifth contact metallization feature in contact with a source/drain of a second access transistor, wherein a centerline passing through a thickness of the fourth contact metallization feature is colinear with a centerline passing through a thickness of the fifth contact metallization feature.

In twentieth examples, for any of the fifteenth through the nineteenth examples the channel regions are first channel regions and the method comprises forming an arithmetic logic unit (ALU) with second transistors comprising a stack of second channel regions patterned to a width larger than that of the first channel regions.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. A computer system, comprising:
an integrated circuit (IC) die, comprising:
arithmetic logic unit (ALU) circuitry comprising a plurality of first transistors, each of the first transistors comprising a stack of first channel regions of first fins having a first width of at least 3 nm; and
a static random-access memory (SRAM), wherein:
a bit-cell of the SRAM consists of four NMOS transistors;
the NMOS transistors are second transistors, each of the second transistors comprising a stack of sec-
ond channel regions of second fins having a second width no more than 2 nm;
the bit-cell has no more than two second fins;
individual ones of the second fins comprise the stack of second channel regions for one access transistor and for one pull-down transistor; and
the second fins have a fin spacing: fin width ratio that is 2-3 times the fin spacing: fin width ratio of the first fins; and
an integrated cooling structure comprising a plurality of microchannels within the IC die, the microchannels to convey a heat transfer liquid that maintains at least the SRAM at a temperature below −50° C. during steady state operation of the SRAM.

2. The system of claim 1, wherein:
the second fins have first longitudinal lengths in a first direction;
the four NMOS transistors comprise gate electrodes having second longitudinal lengths in a second direction, orthogonal to the first direction;
a centerline passing through a thickness of the gate electrode of a first access transistor is substantially colinear with a centerline passing through a thickness of the gate electrode of a first pull-down transistor; and
a centerline passing through a thickness of the gate electrode of a second access transistor is substantially colinear with a centerline passing through a thickness of the gate electrode of a second pull-down transistor.

3. The system of claim 2, wherein:
the four NMOS transistors comprise source/drain contact metallization having third longitudinal lengths in the second direction;
a first source/drain contact metallization of the first pull-down transistor and a first source/drain contact metallization of the second pull-down transistor comprise a single contiguous stripe of metallization spanning the second fins and a space therebetween;
a centerline passing through a thickness of a second source/drain contact metallization of the first pull-down transistor is substantially colinear with a centerline passing through a thickness of a second source/drain contact metallization of the first access transistor; and
a centerline passing through a thickness of a second source/drain contact metallization of the second pull-down transistor is substantially colinear with a centerline passing through a thickness of a second source/drain contact metallization of the second access transistor.

4. The system of claim 1, further comprising a power supply coupled with the IC die to power the IC die during operation.

* * * * *